United States Patent [19]
Murakami et al.

[11] Patent Number: 5,471,076
[45] Date of Patent: Nov. 28, 1995

[54] SEMICONDUCTOR LIGHT-RECEIVING DEVICE WITH GRADED LAYER

[75] Inventors: Tadayoshi Murakami; Hideo Takahashi, both of Hamamatsu, Japan

[73] Assignee: Hamamatsu Photonics K.K., Hamamatsu, Japan

[21] Appl. No.: 274,830

[22] Filed: Jul. 14, 1994

[51] Int. Cl.[6] ............................................ H01L 27/14
[52] U.S. Cl. ..................... 257/184; 257/185; 257/186; 257/190; 257/191
[58] Field of Search ................................. 257/185, 186, 257/184, 190, 191, 192

[56] References Cited

U.S. PATENT DOCUMENTS

| 4,599,632 | 7/1986 | Bethea et al. | 257/186 |
| 4,974,061 | 11/1990 | Torikai | 257/185 X |

FOREIGN PATENT DOCUMENTS

| 0178673 | 4/1986 | European Pat. Off. |  |
| 0470783 | 2/1992 | European Pat. Off. |  |
| 0554846 | 8/1993 | European Pat. Off. |  |
| 55-145339 | 11/1980 | Japan |  |
| 60-260168 | 12/1985 | Japan | 257/186 |
| 6196726 | 5/1986 | Japan |  |
| 2-065279 | 3/1990 | Japan | 257/186 |

OTHER PUBLICATIONS

Makita et al, "Ga/sub-1-y/In/sub y/As/InAs/sub x/P/sub 1-1/(y>0.53, x>0) Pin Photodiodes for long Wavelength Regions (λ>2 μm) Grown by Hydride Vapour Phase Epitaxy", Electronics Letters, 1988, vol. 24, No. 7 pp. 379–380.
Wade et al, "Wide-Wavelength GaInAs Pin Photodiodes Using a Lattice-Mismatched Light-Absorbing Layer and a Thin InP Cap Layer", Japanese Journal of Applied Physics, Part 2 (ltrs.), Aug. 15, 1991, Japan, vol. 30, No. 88, pp. L501–L504.
Moseley et al, "High-Efficiency, Low-Leakage MOCVD-Grown GaInAs/AiIInAs Heterojunction Photodiodes for Detection to 2·4 μm", Electronics Letters, 23 Oct. 1986, vol. 22, No. 22, pp. 1026–1207.
Morrison et al, "InGa$_{1-x}$As Photodetector for the 1.7–2.0 μm Spectral Region", J. Electrochem. Soc.: Solid–State Science and Technology, Jul. 1985, pp. 1717–1720.
Makita et al, "Ga$_{1-y}$In$_y$As/InAs$_x$P$_{1-y}$ (y>0.53, x>0) pin Photodiodes for Long Wavelength Regions (>2 μm) Grown by Hydride Vapour Phase Epitaxy", Electronics Letters, Mar. 31, 1988, vol. 24, No. 7, pp. 379–380.
Ban et al, "Room–Temperature Detectors for 800 2600 nm Based on InGaAsP", SPIE, vol. 1106 Future Infrared Detector Materials (1989), pp. 151–164.

*Primary Examiner*—William Mintel
*Attorney, Agent, or Firm*—Cushman Darby & Cushman

[57] ABSTRACT

A substrate consisting of a compound semiconductor crystal, a buffer layer, a graded layer, a light-absorbing layer having a lattice constant smaller than that of the uppermost mixed crystal sublayer of the graded layer, a p-type conductive layer, another p-type conductive layer, and a capping layer formed on the surface of the light-absorbing layer next to the p-type conductive layer and having almost the same lattice constant as that of the uppermost layer of the graded layer are stacked. An electrode is connected to the substrate, and another electrode is connected to the conductive layer. A tensile force is applied to the light-absorbing layer from the uppermost mixed crystal sublayer of the graded layer, the capping layer, and the conductive layer, thereby suppressing a dark current.

10 Claims, 2 Drawing Sheets

SEMICONDUCTOR LIGHT-RECEIVING DEVICE WITH GRADED LAYER

BACKGROUND OF THE INVENTION

1. Field of the Invention

The present invention relates to a semiconductor photodetector for detecting incident light as first disclosed in Japanese Patent Application No. 5067/1993 filed Jan. 14, 1993, the contents of which are incorporated herein by reference.

2. Related Background Art

Currently, an $In_{1-x}Ga_xAs$ mixed crystal is well known as one of mixed crystal semiconductor materials that may be used for photodetection. By controlling the composition ratio of this mixed crystal semiconductor to change the forbidden bandgap, this mixed crystal can be used as the light-absorbing layer of a photodetector for optical communication, a spectrophotometer, etc. When the composition ratio of this $In_{1-x}Ga_xAs$ mixed crystal is changed, a mixed crystal semiconductor having various bandgaps ranging from that of InAs=0.36 eV to that of GaAs=1.42 eV can be made. For example, with x=0.35, $In_{0.65}Ga_{0.35}As$ has a forbidden bandgap=0.48 eV. This mixed crystal can be used as a light-absorbing layer to manufacture a photodetector having a sensitivity up to a wavelength of 2.0 μm. As the value x becomes smaller, a photodetector having a sensitivity to a longer wavelength can be made.

However, when the composition ratio of the mixed crystal is changed, not only the bandgap but also the lattice constant changes. When x=0.35, the lattice constant =5.9166 Å which is substantially different from that of InP=5.8688 Å. Generally, when a crystal having a lattice constant substantially different from that of a substrate is grown on the substrate, a lot of dislocations are induced from its interface to degrade the crystalline quality. For this reason, no crystal suitable for practical use can be obtained. However, when the difference between the lattice constants is very small, a relatively satisfactory epitaxial layer can be obtained. By using this, the composition ratio of the mixed crystal is changed in the growing direction of the epitaxial layer to gradually change the lattice constant, thereby finally growing an epitaxial layer having a composition ratio with a desired lattice constant, i.e., bandgap. These layers are called a graded layer as a whole. When a photodetector is to be manufactured, a light-absorbing layer and a capping layer are sequentially epitaxially grown on the surface of the graded layer. Conventionally, to maintain the good crystallinity of the light-absorbing layer, a composition ratio is applied such that the lattice constants of the uppermost layer of the graded layer and the capping layer are equalized with that of the light-absorbing layer.

The conventional semiconductor photodetector has the above structure. With this structure, however, since a dark current is large, weak incident light cannot be detected with high accuracy.

SUMMARY OF THE INVENTION

It is an object of the present invention to provide a semiconductor photodetector capable of reducing a dark current value.

According to the present invention, there is provided a semiconductor photodetector comprising (a) a substrate consisting of a compound semiconductor crystal having a first conductivity type, (b) a first electrode formed on a first surface of the substrate, (c) a graded layer having stacked mixed crystal sublayers sequentially epitaxially grown on a second surface of the substrate and consisting of at least two types of compound semiconductors having a first conductivity type and a different composition ratio, (d) a light-absorbing layer epitaxially grown on a surface of the graded layer and having a lattice constant smaller than that of an uppermost mixed crystal sublayer of the graded layer, (e) a first conductive layer having a second conductivity type and formed by diffusing an impurity near a first region of a surface of the light-absorbing layer from the first region toward the graded layer, (f) a second conductive layer formed on a surface of the first conductive layer, having almost the same lattice constant as that of the uppermost layer of the graded layer, and having a second conductivity type, (g) a capping layer, formed on the surface of the light-absorbing layer next to the second conductive layer, having almost the same lattice constant as that of the uppermost layer of the graded layer, and consisting of a compound semiconductor mixed crystal having the first conductivity type, and (h) a second electrode formed on a surface of the second conductive layer.

It is preferable that ① the substrate consists of an n-type InP crystal, ② the graded layer consists of at least two n-type InAsP mixed crystal sublayers having different composition ratios of As and P to In, ③ the light-absorbing layer consists of an n-type InGaAs mixed crystal, and ④ the capping layer consists of an n-type InAsP mixed crystal.

Another semiconductor photodetector according to the present invention further comprises, between the substrate and the graded layer, a buffer layer consisting of the compound semiconductor crystal forming the substrate having the first conductivity type.

It is preferable that ① the substrate consists of an n-type InP crystal, ② the buffer layer consists of an n-type InP crystal, ③ the graded layer consists of at least two n-type InAsP mixed crystal sublayers having different composition ratios of As and P to In, ④ the light-absorbing layer consists of an n-type InGaAs mixed crystal, and ⑤ the capping layer consists of an n-type InAsP mixed crystal.

The conductive layers can be formed by diffusing Zn in the InAsP mixed crystal forming the capping layer and the InGaAs mixed crystal forming the light-absorbing layer.

It is preferable that the degree of mismatching between the lattice constant of the light-absorbing layer and that of the uppermost layer of the graded layer or the capping layer falls within a range of −0.5% to −0.2%.

In the semiconductor photodetector of the present invention, when the light-absorbing layer is illuminated, a current is generated in accordance the light intensity to provide a function as a photodetector, as in the prior art. At the same time, the light-absorbing layer receives a tensile force from the uppermost layer of the graded layer, the capping layer, and the second conductive layer, which are formed on the upper or lower side of the light-absorbing layer and have lattice constants larger than that of the light-absorbing layer. This tensile force serves to increase the lattice constant of the light-absorbing layer, thereby suppressing the dark current.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

An embodiment of the present invention will be described below with reference to the accompanying drawings.

Figure 1:
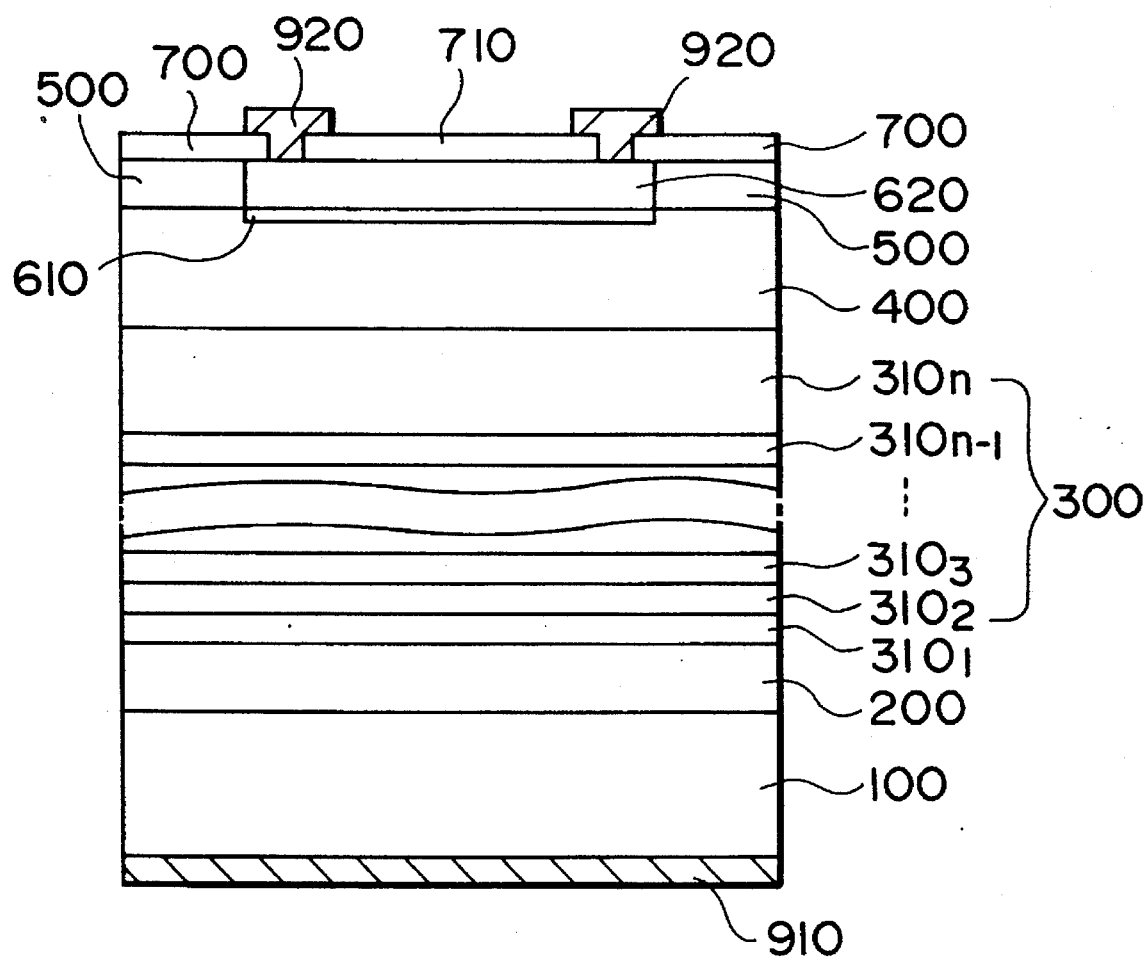
FIG. 1 is a sectional view showing the structure of a semiconductor photodetector according to an embodiment of the present invention.

FIG. 1 is a sectional view showing the structure of a semiconductor photodetector according to an embodiment of the present invention. This semiconductor photodetector is constituted by (a) a substrate 100 consisting of an n-type InP crystal, (b) a first electrode 910 formed on one surface of the substrate 100, (c) a buffer layer 200 (thickness of about 1 μm) formed on the other surface of the substrate and consisting of an n-type InP crystal, (d) a graded layer 300 having stacked sublayers $310_1$ to $310_n$ ($310_1$ to $310_{n-1}$: thickness of about 1 μm, $310_n$: thickness of about 3 μm) sequentially epitaxially grown on the surface of the buffer layer 200 and consisting of two or more types of n-type InAsP mixed crystals having a different composition ratio, (e) a light-absorbing layer 400 (thickness of about 3 μm) epitaxially grown on the surface of the graded layer 300 and consisting of an n-type InGaAs mixed crystal having a lattice constant smaller than that of the uppermost mixed crystal sublayer $310_n$ of the graded layer, (f) a p-type conductive layer 610 formed near the surface of the light-absorbing layer 400 and consisting of a Zn-doped InGaAs mixed crystal, (g) a p-type conductive layer 620 (thickness of about 1 μm) formed on the surface of the p-type conductive layer 610, having almost the same lattice constant as that of the uppermost layer $310_n$ of the graded layer 300, and consisting of a Zn-doped InAsP mixed crystal, (h) a capping layer 500 (thickness of about 1 μm) formed on the surface of the light-absorbing layer 400 next to the p-type conductive layer 620, having almost the same lattice constant as that of the uppermost layer of the graded layer 300, and consisting of a compound semiconductor mixed crystal having a first conductivity type, (i) an insulating film 700 formed on the surfaces of the capping layer 500 and the p-type conductive layer 620 and having an opening in the upper portion of the p-type conductive layer 620, (j) an anti-reflection layer 710 formed on the surface of the p-type conductive layer, and (k) a second electrode 920 connected to the p-type conductive layer 620.

Light transmitted through the anti-reflection layer 710 reaches the light-absorbing layer 400 and is absorbed by the light-absorbing layer 400. This light absorption generates a signal charge in the light-absorbing layer 400, and a current is generated between the first and second electrodes. Hence, a function as a photodetector can be obtained. The light-absorbing layer 400 receives a tensile force from the uppermost layer $310_n$ of the graded layer 300, a capping layer 500, and a conductive layer 620, which are formed on the upper or lower side of the light-absorbing layer 400 and have lattice constants larger than that of the light-absorbing layer 400. This tensile force serves to increase the lattice constant of the light-absorbing layer 400 and keep a dark current suppressed.

Figure 2:
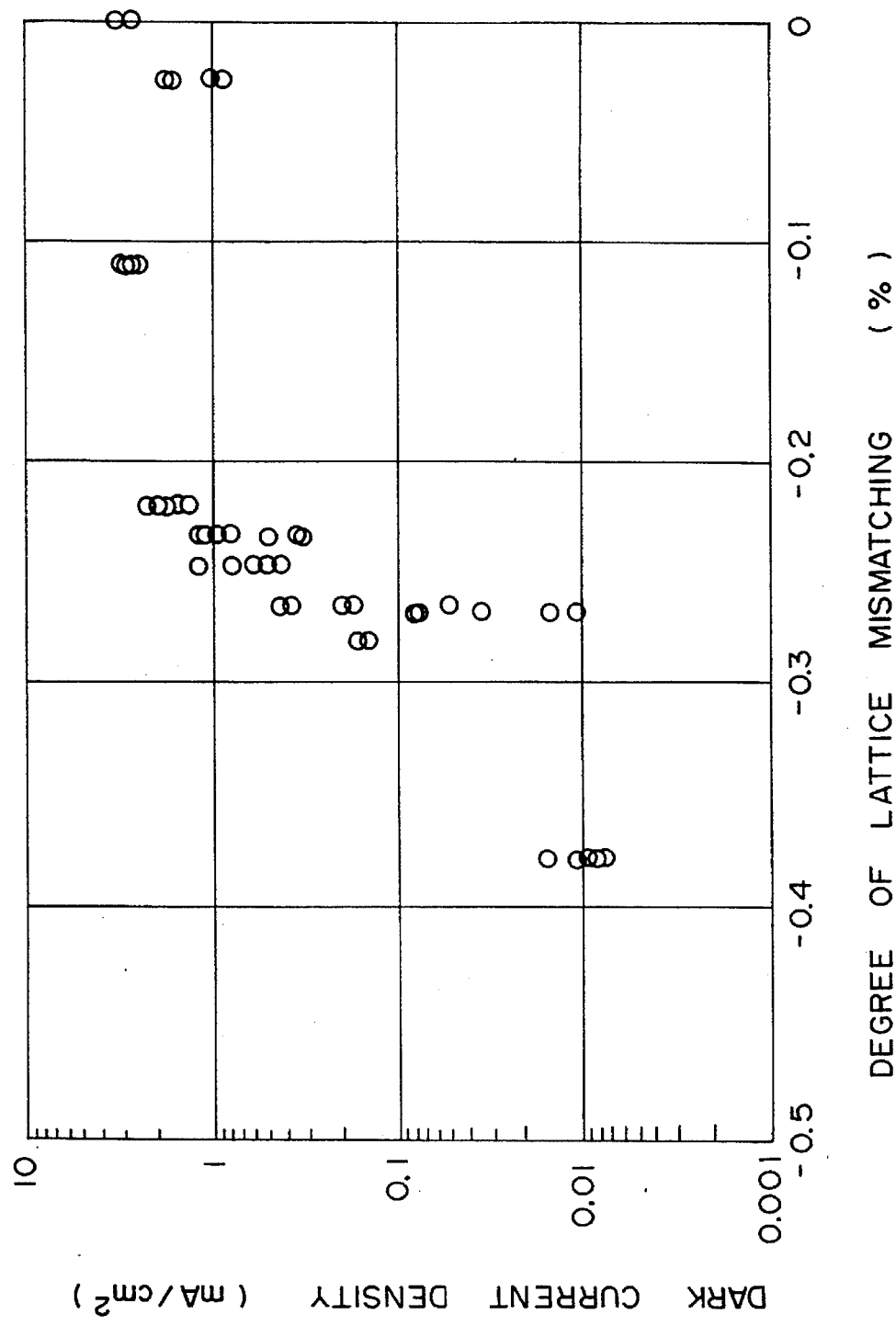
FIG. 2 is a graph showing reduction of a dark current by the semiconductor photodetector according to the embodiment of the present invention.

The present inventor manufactured semiconductor photodetector samples with the above structure having a light-absorbing layer consisting of $In_{0.65}Ga_{0.35}As$. These samples had various degrees of mismatching between the lattice constant of the light-absorbing layer and that of the uppermost layer of the graded layer or the capping layer. The relationship between the degree of lattice mismatching and a dark current density in the light-absorbing layer was obtained by experiments. FIG. 2 is a graph showing the experimental results and reduction of the dark current generated by mismatching between the lattice constant of the light-absorbing layer and that of the uppermost layer of the graded layer or the capping layer in the semiconductor photodetector with the above structure. The degree of mismatching between the lattice constants is plotted along the abscissa and represented by the following equation.

$$\Delta A/A = (\text{lattice constant of light absorption layer} - A)/A \quad (1)$$

where A: lattice constant of the capping layer or the uppermost layer of the graded layer.

The density of the dark current flowing in the light-absorbing layer is plotted along the ordinate. Referring to FIG. 2, as the degree of mismatching between the lattice constants increases, the dark current density exponentially decreases. When the degree of lattice mismatching falls within a range of $-0.5\% \leq \Delta A/A \leq -0.2\%$ rather than $-0.2\% \leq \Delta A/A \leq 0\%$, the dark current decreases by 10 to 100 times. When the degree of lattice mismatching satisfies $\Delta A/A < -0.5\%$, no satisfactory epitaxial layer can be obtained.

The present invention is not limited to the above embodiment, and various changes and modifications can be made. For example, the graded layer may be formed by epitaxially growing a $GaAs_{1-y}P_y$ mixed crystal on a GaAs bulk crystal while changing a value y. If the conditions of the lattice constant and the epitaxial growth are properly set, the semiconductor photodetector of the present invention can be constituted using other compound semiconductor materials.

As has been described above, according to the semiconductor photodetector of the present invention, the layers having lattice constants larger than that of the light-absorbing layer are formed on or under the light-absorbing layer. For this reason, when the light-absorbing layer is illuminated, a current is generated in accordance with the energy amount of the absorbed light to provide a function as a photodetector, as in the prior art. At the same time, the light-absorbing layer receives a tensile force from the upper and lower layers. This tensile force serves to increase the lattice constant of the light-absorbing layer, thereby realizing a semiconductor photodetector for effectively suppressing a dark current.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor photodetector comprising:
    a substrate consisting of a compound semiconductor crystal having a first conductivity type;

a first electrode formed on a first surface of said substrate;

a graded layer having stacked mixed crystal sublayers sequentially epitaxially grown on a second surface of said substrate and consisting of at least two types of compound semiconductors having the first conductivity type and a different composition ratio;

a light-absorbing layer epitaxially grown on a surface of said graded layer and having a lattice constant smaller than that of an uppermost mixed crystal sublayer of said graded layer;

a first conductive layer having a second conductivity type and formed by diffusing an impurity near a first region of a surface of said light-absorbing layer from said first region toward said graded layer;

a second conductive layer formed on a surface of said first conductive layer, having a lattice constant substantially similar to but not equal to that of said uppermost layer of said graded layer, and having the second conductivity type;

a capping layer, formed on said surface of said light-absorbing layer next to said second conductive layer, having a lattice constant substantially similar to but not equal to that of said uppermost layer of said graded layer, and consisting of a compound semiconductor mixed crystal having the first conductivity type; and a second electrode formed on a surface of said second conductive layer.

2. A device according to claim 1, wherein said substrate consists of an n-type InP crystal, said graded layer consists of at least two n-type InAsP mixed crystal sublayers having different composition ratios of As and P to In, said light-absorbing layer consists of an n-type InGaAs mixed crystal, and said capping layer consists of an n-type InAsP mixed crystal.

3. A device according to claim 2, wherein said first conductive layer is formed by diffusing Zn in said InGaAs mixed crystal forming said light-absorbing layer.

4. A device according to claim 2, wherein said second conductive layer is formed by diffusing Zn in said InAsP mixed crystal forming said capping layer.

5. A device according to claim 2, wherein a degree of mismatching between the lattice constant of said light-absorbing layer and that of one of said uppermost layer of said graded and said capping layer falls within a range of −0.5% to −0.2% where said degree of mismatching is calculated as follows:

(lattice constant of the light absorbing layer-lattice constant of the capping layer or uppermost layer of the graded layer)/the lattice constant of the capping layer or the uppermost layer of the graded layer.

6. A device according to claim 1, further comprising, between said substrate and said graded layer, a buffer layer consisting of said compound semiconductor crystal having the first conductivity type and having said substrate.

7. A device according to claim 6, wherein said substrate consists of an n-type InP crystal, said buffer layer consists of an n-type InP crystal, said graded layer consists of at least two n-type InAsP mixed crystal sublayers having different composition ratios of As and P to In, said light-absorbing layer consists of an n-type InGaAs mixed crystal, and said capping layer consists of an n-type InAsP mixed crystal.

8. A device according to claim 7, wherein said first conductive layer is formed by diffusing Zn in said InGaAs mixed crystal forming said light-absorbing layer.

9. A device according to claim 7, wherein said second conductive layer is formed by diffusing Zn in said InAsP mixed crystal forming said capping layer.

10. A device according to claim 7, wherein a degree of mismatching between the lattice constant of said light-absorbing layer and that of one of said uppermost layers of said graded layer and said capping layer falls within a range of −0.5% to −0.2% where said degree of mismatching is calculated as follows:

(lattice constant of the light absorbing layer-lattice constant of the capping layer or uppermost layer of the graded layer)/the lattice constant of the capping layer or the uppermost layer of the graded layer.

* * * * *